(12) United States Patent
Barnes

(10) Patent No.: US 11,009,717 B2
(45) Date of Patent: May 18, 2021

(54) STACKABLE LASER BEAM MODULE ASSEMBLY

(71) Applicant: Andrew Barnes, Seattle, WA (US)

(72) Inventor: Andrew Barnes, Seattle, WA (US)

( * ) Notice: Subject to any disclaimer, the term of this patent is extended or adjusted under 35 U.S.C. 154(b) by 150 days.

(21) Appl. No.: 16/247,568

(22) Filed: Jan. 15, 2019

(65) Prior Publication Data

US 2020/0225500 A1     Jul. 16, 2020

(51) Int. Cl.
*G02B 27/12*     (2006.01)
*G02B 27/10*     (2006.01)
(Continued)

(52) U.S. Cl.
CPC ....... *G02B 27/123* (2013.01); *G02B 27/1073* (2013.01); *G02B 27/30* (2013.01); *H01S 5/02253* (2021.01)

(58) Field of Classification Search
CPC .. G02B 27/123; G02B 27/1006; G02B 27/12; G02B 27/10; G02B 27/126; G02B 27/0927; G02B 27/106; G02B 27/143; G02B 27/283; G02B 27/1073; G02B 27/145; G02B 27/0961; G02B 27/1086; G02B 27/144; G02B 27/30; G02B 17/0888; G02B 2027/0178; G02B 27/0025; G02B 27/0172; G02B 27/1013; H01S 5/4012; H01S 5/02284; H01S 5/4087; H01S 5/4062; H01S 3/09415; H01S 3/2383; H01S 5/005; H01S 5/02248; H01S 5/4025; H01S 5/4075; H01S 2301/206; H01S 3/005; H01S 3/094003; H01S 3/09408; H01S 3/094096; H01S 3/2391; H01S 3/302; H01S 5/0071; H01S 5/02; H01S 5/02208; G03F 7/70566; G03F 7/70225; G03F 7/70058; G03F 7/70358; G03F 7/7055; G03F 7/70966; G03F 7/70083; G03F 7/702; G03F 7/70233; G03F 7/70066; G03F 7/70075; G03F 7/70283; G03F 7/70308; G03F 7/70891; G03F 7/70983; G02F 1/0136; G02F 1/09; G02F 1/133524; G02F 1/133621; G02F 2001/133562; G02F 1/13336; G02F 1/133526; G02F 1/13363; G02F 1/133634; G02F 1/133636; G02F 1/21; G02F 1/3526; G02F 1/39; G02F 2001/133623; G02F 2001/212; G02F 2201/30; G02F 2203/24; G02F 2203/34; G02F 2413/03;
(Continued)

(56) References Cited

U.S. PATENT DOCUMENTS 6,215,807 B1 *   4/2001   Reilly .................. H01S 3/2383
                                                                               372/23
7,843,644 B1 *   11/2010   Wang .................... G02B 6/262
                                                                               359/641
(Continued)

*Primary Examiner* — William R Alexander
*Assistant Examiner* — Sharrief I Broome

(57) ABSTRACT

A stackable beam module assembly and system for combining laser beams by recursive coupling of one or more beam modules whereby successive converging and diverging lenses having optical properties and an orientation in central beam channels and peripheral beam channels to direct the peripheral beams in a direction parallel to the central beams to thereby propagate a resultant beam having an increased power output directly correlated to the sum of the combined laser beams.

18 Claims, 11 Drawing Sheets

(51) Int. Cl.
　　　*H01S 5/022*　　　　(2021.01)
　　　*G02B 27/30*　　　　(2006.01)
　　　*H01S 5/02253*　　(2021.01)

(58) Field of Classification Search
　　　CPC .......................... G02F 2413/07; H04N 13/305;
　　　　　　　H04N 13/363; H04N 2013/403; H04N
　　　　　　　9/3105; H04N 13/239; H04N 13/31;
　　　　　　　H04N 13/327; H04N 13/334; H04N
　　　　　　　13/337; H04N 13/341; H04N 13/344;
　　　　　　　H04N 13/361; H04N 5/7441; H04N
　　　　　　　9/3111; H04N 9/3152; H04N 9/3161;
　　　　　　　　　　H04N 9/3164; H04N 9/317
　　　See application file for complete search history.

(56)　　　　　　　　References Cited

U.S. PATENT DOCUMENTS

2004/0252744  A1*  12/2004  Anikitchev .......... G02B 27/283
　　　　　　　　　　　　　　　　　　　　　　　　372/100
2010/0165435  A1*  7/2010   Grapov .............. B23K 26/0676
　　　　　　　　　　　　　　　　　　　　　　　　359/226.1

* cited by examiner

STACKABLE LASER BEAM MODULE ASSEMBLY

FIELD OF THE INVENTION

The present invention relates to a device and method for augmenting the power of laser beams, particularly a modular laser system for combining one or more peripheral beams with a central beam.

BACKGROUND OF THE INVENTION

Laser devices are deployed in diverse applications: medical procedures, electronic functionalities, industrial fabrication, telecommunications, as well as numerous lighting and optical applications. The number and variety of types, configurations, output levels and sophistication of laser modules is commensurate to the diversity of applications for laser devices. The efficacy of laser devices for such multifarious applications have led to the design and manufacture of many diverse laser instruments and equipment limited to specialized, dedicated and customized use. The narrow scope of conventional lasers and their markets have stymied mass production and related scales of economy which reduce the cost and boost the availability of many ubiquitous electronic devices, particularly devices for the mass consumer market. In contrast, the high cost and lack of adaptive and diverse applications to common uses of conventional laser devices as well as the scarcity, and perhaps unavailability, and expense of components, especially for sophisticated and high-power applications, and repair services continue to limit their accessibility and use.

Certain applications, such as industrial fabrication, require a wide range of laser beam power to enable capability for working with a range of materials and processes. Contemporary laser systems employ one or few laser sources suitable to achieve the maximum expected power, and further employ modulation techniques to interrupt the laser beam according to a duty cycle. The present invention includes a plurality of laser sources, such that individual laser sources may be activated at full duty cycle to achieve a desired power output level while maintaining an optimal efficiency.

In some applications, such as telecommunications, it is desirable for the laser beam system to have features which preserve beam integrity even in the event of a failure. In conventional laser beam systems with one or few laser sources, the failure of a single source can result in significant loss of performance. The present invention, which includes a plurality of laser sources, will remain functional at or near the intended power level even in the event of a failure of one or more laser sources.

The cost of high-power laser systems is increased due to the limited number of laser sources that can be combined, wherein each source must be proportionately powerful to produce the desired overall beam power. As the power level of each individual laser source is increased, the scarcity and cost also increase in an exponential relation, for example a laser with twice the power might have ten times the cost and require highly specialized components. The current invention achieves greater power with a greater number of laser sources, all having the same lower power and corresponding low cost and broad availability. In this manner, the cost of increased power using the present invention is nearly linear such that increasing the beam power by a factor of two would also increase the cost by a factor of two, with no effect on component availability.

Conventional laser devices are single-stage or single-end systems for aligning or combining one or more secondary beams, and typically employ reflective surfaces for directing trajectories of secondary beams onto a common beam path. However, such existing methods for combining beams have limited capacity and application. That is, conventional assemblies are limited to a fixed number of laser sources/elements having limited and specialized applications and lacking adaptive functionalities for adjusting power levels in accordance with a particular application in order to boost efficiency. Further limitations of prior art laser devices include restrictions for particular frequencies and from combining multiple beams having the same frequency. Such and other limitations on the versatility and adaptability of conventional laser systems have led to multiple disadvantages and drawbacks that have narrowed their use to limited and specialized applications and markets.

Hence, there remains a persisting need for an adaptable, failure tolerant, and cost-effective laser device and system suitable for manufacturing and marketing scales of economy to address such disadvantages and drawbacks.

SUMMARY OF THE INVENTION

In view of the need for an adaptive, efficacious laser device, the present invention is drawn toward a stackable beam module assembly and method for concentrating laser beams by recursive coupling of one or more modular beam augmenters whereby successive converging and diverging lenses, having optical properties and an orientation in a central beam channel, and peripheral channels to direct the peripheral beams in a direction parallel to the central beams to thereby propagate a resultant beam having an increased power output directly correlated to the sum of the combined laser beams.

The modular nature of the present invention enables multifarious advantages, including proportional power increase achieved by arranging multiple instances of an ordinary beam module in recursive configuration, such that each module provides additional power augmentation, with no theoretical limit to the number of modules in a recursive arrangement. For example, single modules or a "short" stack of beam modules may be utilized for soft materials. A beam module assembly may be adapted for intermediate power applications such as, for example, medical, dental, or cosmetic treatments, by addition of a suitable number of beam modules corresponding to the desired intensity for the relevant procedures. The number of beam modules further enables continued operation in the case of a laser source failure with minimal impact to performance. Addition of a greater number of beam modules yields stacks propagating high intensity lasers suitable for heavy industrial applications, such as, cutting harder materials such as structural steel.

A further advantage of the present invention is provided by the ability to utilize standard and commercially available elements; where the ability to link many modules together to form a single beam enables the use of components with lesser performance and corresponding lower cost and greater availability. Thus, the recursive stackability of the present beam module assembly imparts adaptive versatility and reliability for accommodating diverse and widespread usage and scalability for manufacturing and distribution, thereby improving the economies and accessibility of the present beam module assembly and its components. Hence, the advantages and utilities provided by the present invention are many and significantly impactful.

As used herein, identical, recurring beam modules of the present invention are referenced according to its function relative to other beam modules in a recursive stack. It is noted that the beam modules and functionalities as a "feeder" or "preceding" or "one of the" beam modules relative to a "host" or "succeeding" or "another of the" beam modules relate only to the position relative to the beam module to which it is directly coupled, and that the same beam module may concurrently function as both a "feeder" or "preceding" as well as a "host" or "succeeding" module in a recursive stack. The meaning of the terms is limited to expressing a functional relation to an adjacent, either preceding or succeeding, beam module and does not state or implicate that there are any structural dissimilarities in the beam modules of the assembly. For consistent terminology in compliance with antecedent requirements for referencing the plurality of beam modules in the body of the claims applicant refers to a beam module functioning as a feeder module, where the resultant beam is propagated as a peripheral beam or central beam relative to a succeeding beam module, as "one of the beam modules" and a beam module functioning as a host module, where a peripheral beam or central beam is propagated by the resultant beam of a preceding beam module, as "another of the beam modules."

Structurally, the stackable beam module assembly according to the present invention includes a housing having a central beam channel along a longitudinal axis of the housing, wherein an input port and an output port are disposed on opposing ends of the central beam channel. This beam module also includes a converging lens affixed within the central beam channel such that the optical plane of the converging lens is in generally perpendicular alignment with the longitudinal axis of the housing, wherein the converging lens is spaced back in a direction toward the input port; and a diverging lens affixed within the central beam channel such that the optical plane of the diverging lens is in generally perpendicular alignment with the longitudinal axis of the housing, wherein the diverging lens is spaced back in a direction toward the output port a distance predetermined by optical properties of the converging lens and diverging lens whereby a central beam collinear to the longitudinal axis and passing through the central beam channel remains coherent and collinear.

A further feature of the module includes at least one peripheral beam channel having a peripheral input port, wherein the peripheral input port is configured for directing a peripheral beam at a predetermined angle along a peripheral beam axis through the peripheral beam channel and toward the diverging lens, whereby the diverging lens refracts the peripheral beam as a coherent beam in a direction substantially coaxial with the central beam channel, wherein a resultant beam includes the central beam and the at least one peripheral beam such that the power of the resultant beam is proportional to the sum of the central beam and the at least one peripheral beam.

In a preferred embodiment, a peripheral converging lens is positioned within the at least one peripheral beam channel such that the optical plane of the peripheral converging lens is in generally perpendicular alignment with the peripheral beam axis, wherein the peripheral converging lens is spaced back from the diverging lens in a direction toward the peripheral port a distance predetermined by optical properties of the peripheral converging lens and diverging lens whereby a coherent beam propagating into the peripheral input port is refracted by the peripheral converging and by the diverging lens as a coherent beam in a direction substantially coaxial with the central beam channel.

Alternative embodiments may employ a secondary converging lens and secondary converging lens proximal to the output port of the beam module, where the secondary converging lens is spaced back from the diverging lens in a direction toward the output port and the secondary diverging lens is spaced back in a direction toward the output port a distance predetermined by optical properties of the secondary converging lens and secondary diverging lens whereby a resultant beam propagates from the diverging lens and through the secondary converging lens and secondary diverging lens such that the secondary resultant beam is coherent and coaxial with the central beam channel, and where the circumscribed beam diameter of the secondary resultant beam is smaller than the circumscribed diameter of the resultant beam according to the optical properties of the secondary converging lens and secondary diverging lens.

The present invention further includes a connective structure, disposed on an exterior surface of the housing and proximal to the input port, engageable with a connective coupler proximate to the output port of one of the beam modules wherein coupled engagement of the connective structure with the connective coupler positions the output port of one of the beam modules with the input port of another of the beam modules, such that the longitudinal axis of the housing of both of the beam modules are collinear to thereby sequentially connect the one of the beam modules with the another of the beam modules whereby the resultant beam of the one of the beam modules propagates as the central beam of the another of the beam modules; thus one of the beam modules coupled with another of the beam modules comprise a sequential configuration.

In preferred embodiments of the present invention, the beam module includes a plurality of connective recesses, radially spaced about the longitudinal axis, on an exterior surface of the housing proximal to the peripheral input ports of peripheral beam channels and one of the beam modules has a connective coupler portion proximate to the output port, wherein coupled engagement links the output port of one of the beam modules with one of the peripheral input ports of another of the beam modules; thereby positioning the beam modules in a nested configuration such that the resultant beams of the at least one of the beam modules are directed into the peripheral input ports as peripheral beams of the another of the beam modules.

A particularly preferred embodiment of the nested configuration further includes an adaptive housing having a channel with an adaptive inlet end, an adaptive outlet end, and an adaptive converging lens oriented therebetween; such that when the adaptive inlet end is coupled with the output port of the one of the beam modules and the adaptive outlet end is coupled with the peripheral input port of the another of the beam modules, the adaptive converging lens is spaced back from the diverging lens of the another of the beam modules such that the resultant beam of the one of the beam modules is directed into the peripheral input port of the another of the beam modules as the peripheral beam. A plurality of adaptive housings thus couples a plurality of the one of the beam modules with another of the beam modules such that the resultant beam of each of the one of the beam modules propagates as a peripheral beam through a corresponding peripheral input port of the another of the beam modules.

In particularly preferred embodiments of the present invention, connective recesses include a threaded wall and the adaptive housing has a threaded portion proximate to the adaptive outlet end corresponding to the threaded wall such that threaded engagement of the threaded wall and the threaded portion orients the one of the beam modules in a nested configuration with the another of the beam modules.

A particularly efficacious embodiment of the present invention utilizes a laser diode as the source of a peripheral beam, oriented to propagate a peripheral beam in a direction that refracts through the diverging lens to thereby propagate a coherent beam in the resultant beam substantially coaxial with the central beam channel of the one of the beam modules.

A particularly preferred embodiment further includes a diode capsule comprised of a laser diode, collimating lens, and capsule converging lens and having an outer surface; where the outer surface of the diode capsule includes a threaded portion corresponding to a threaded wall of a connective recess such that threaded engagement of the threaded portion with the threaded wall positions the laser diode and collimating lens to propagate a coherent beam as a peripheral beam along the one of the peripheral beam axis of the beam module, and further positions the optical plane of the capsule converging lens in general perpendicular alignment with the peripheral beam channel at a distance from the diverging lens such that the peripheral beam is refracted by the diode converging lens and by the diverging lens as a coherent beam substantially parallel to the central beam channel.

In alternative embodiments, preferred connective structures include connective recesses radially spaced about an outer surface of the housing of the beam module wherein the connective coupler includes a casing with a slightly larger diameter configured for threaded, or alternatively, tensioned engagement with the connective recess such that the resultant beam from the diode capsule or of the output port of the one of the beam modules thereby propagates as the one of the peripheral beams into the one of the peripheral input ports of the another of the beam modules.

In alternative embodiments, a reflective surface is affixed to the housing structure, wherein the reflective surface is oriented for directing the peripheral beam in a direction at a predetermined angle toward the longitudinal axis such that the diverging lens refracts the peripheral beam in a direction substantially parallel with the central beam and thereby propagate a resultant beam through the output port.

It can thus be readily understood that by coupling output ports of the at least one of the beam modules to corresponding input ports or peripheral input ports of another of the beam modules, which may be accomplished by employing connective couplers or adaptive housings, the present invention provides diverse stackable beam assemblies for providing power output levels commensurate to the intensities of the combined lasers. The arrangements may include various combinations of modules in sequential configuration stacking central beam channels end-to-end, and modules in nested configuration linking the output port of a plurality of the one of the beam modules with the plurality of peripheral input ports of another of the beam modules, and diode capsules coupled with peripheral input ports. Nested configurations may be integrated with one or more sequential configurations and with one or more diode capsules in virtually infinite combinations enabling diverse configurations, including large scale amplification of power outputs for intense or heavy industrial applications.

It is contemplated that the device and method of the present invention may be used to intensify virtually any frequency of the monochromatic or electromagnetic spectrum and is particularly efficacious for applications of ultraviolet through infrared radiation of wavelengths between 200 and 2000 nm. The term "laser" or "beam" is used therein to refer to any intense beam of coherent electromagnetic radiation.

BRIEF DESCRIPTION OF THE DRAWINGS

The accompanying drawings, which are incorporated in and constitute a part of this specification, illustrate embodiments of the invention and, together with the description, serve to explain the principles of the invention; and, furthermore, are not intended in any manner to limit the scope of the invention.

DETAILED DESCRIPTION OF THE PREFERRED EMBODIMENT

Figure 1:
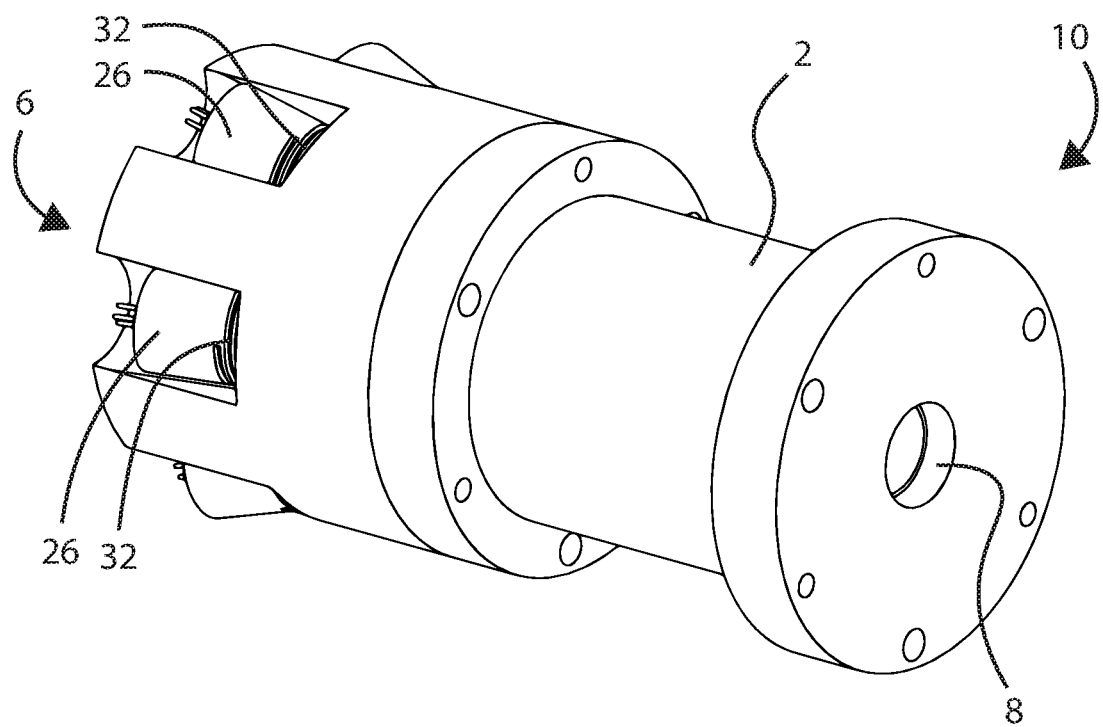
FIG. 1 illustrates a side perspective view of the preferred embodiment of the stackable beam module of the present invention showing the input port thereof.

The present invention will now be described more fully hereinafter with reference to the accompanying drawings in FIGS. 1-9 illustrating a particularly preferred embodiment of the present invention.

As shown in the exemplary drawings of the present stackable beam module assembly, stackable beam module 10 includes housing 2 defining a central beam channel 4 having an input port 6 and output port 8. Housing 2 is preferably composed of aluminum, but alternatively may be composed of any thermally conductive material capable of dissipating heat generated by the laser module assembly including, for example, copper or any metal, solid plastic or molded polymer, glass, borosilicate or even wood.

Figure 2:
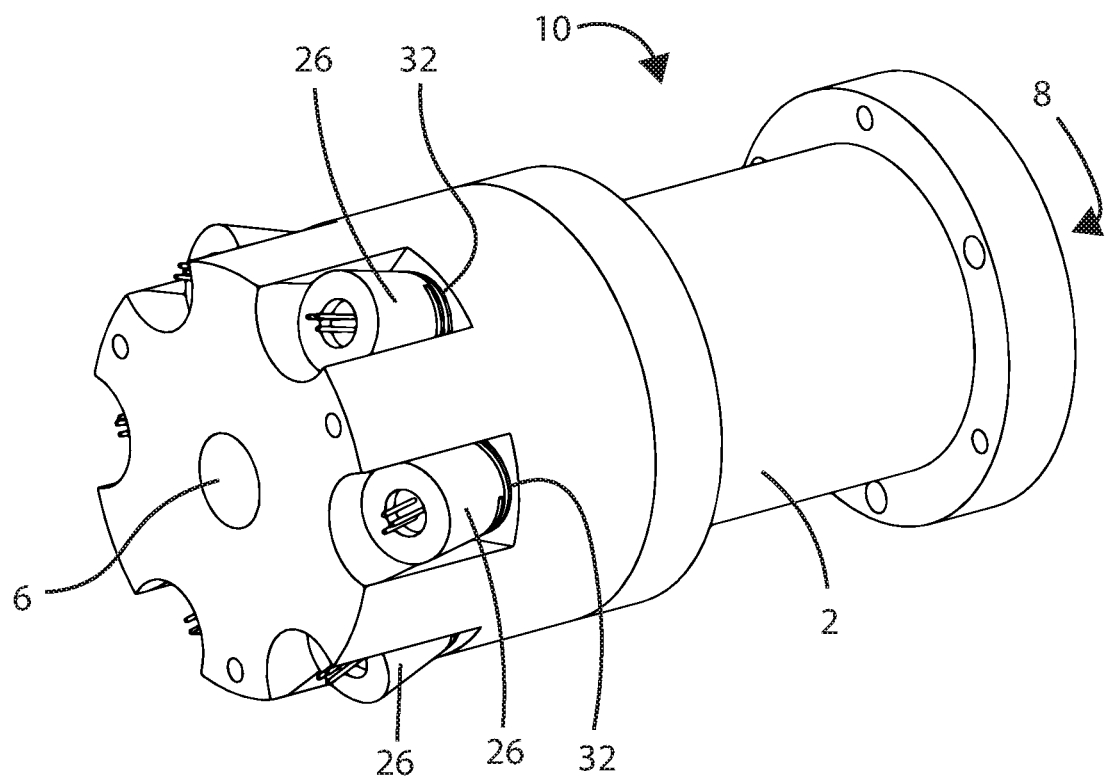
FIG. 2 illustrates a side perspective view of the preferred embodiment of the stackable beam module of the present invention showing the output port thereof.
Figure 3:
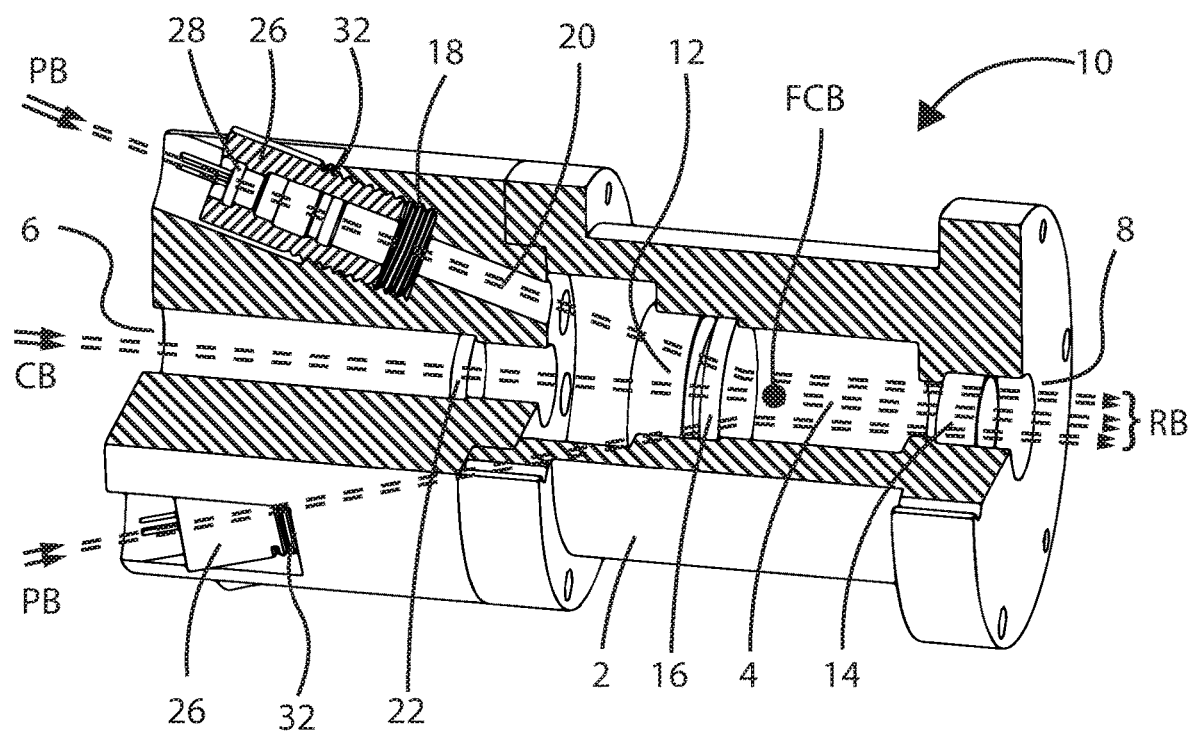
FIG. 3 is a cut-away view of the preferred embodiment of the stackable beam module of the present invention shown in FIGS. 1 and 2 illustrating interior components thereof.

Referring to FIG. 3, converging lens 22 and diverging lens 12 having predetermined optical properties to impart functionalities in accordance with the present invention as shown and described, are affixed within the central beam channel 4 such that their principal optical planes are oriented in generally parallel alignment to each other and are in generally perpendicular alignment with the longitudinal axis of the central beam channel. Converging lens 22 is spaced back at a predetermined distance from the diverging lens 12 in a direction toward the input port 6 such that a focal point FCB of the converging lens 22 and diverging lens 12 are coincident. Specifications for converging lens 22 and diverging lens 12 may be determined by persons of ordinary skill in the art based on the laser optics described and claimed herein and are commercially available through optical lens suppliers such as Edmund Optics. In the exemplary embodiment such as shown in FIGS. 1-9, converging lens 22 is of plano-convex configuration having a diameter of 11 millimeters and an effective focal length of 40 millimeters. The exemplary embodiment of diverging lens 12 is of double-concave configuration having a diameter of 21 millimeters and an effective focal length of −15 millimeters.

The exemplary embodiment of the invention as shown in FIGS. 1-3 includes an array of peripheral beam channels 20, with corresponding peripheral input ports 32 and threaded connective recesses 18, in radial arrangement about the longitudinal axis. In the illustrated embodiment, there are six peripheral beam channels 20 spaced radially about the longitudinal axis of central beam channel 4, each at an 18-degree angle from the longitudinal axis.

Figure 3A:
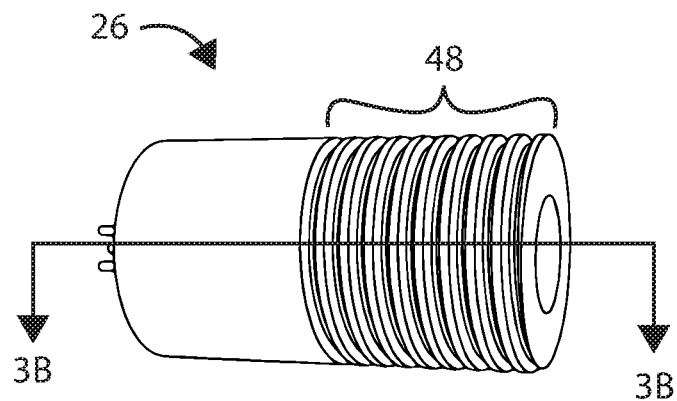
FIG. 3A is a close-up view of the diode capsule according to the present invention.
Figure 3B:
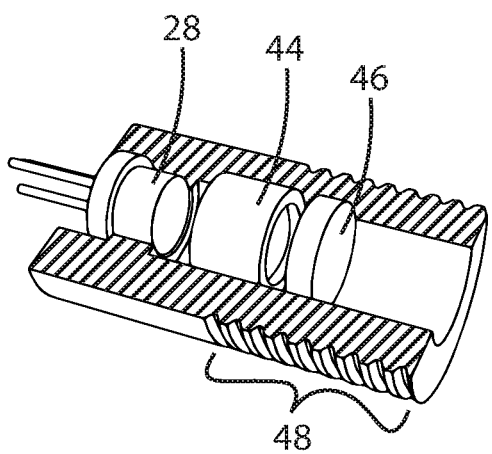
FIG. 3B is a cut-away view of the diode capsule of FIG. 3A.

Now referring to FIGS. 3A and 3B as well as FIG. 3, the illustrated embodiment employs laser diode 28 affixed within a diode capsule 26, which also contains and positions collimating lens 44 at a distance from laser diode 28 to propagate a coherent beam. Diode capsule 26 further contains and positions capsule converging lens 46 at a predetermined distance from focal point FCB, and additionally includes an outer surface with a capsule threaded portion 48 such that the capsule may be engaged with the threaded connective recess 18 of a peripheral input port 32 to propagate a peripheral beam PB through the corresponding peripheral beam channel 20. The exemplary embodiment of laser diode 28 has an optical power of 1 W at a wavelength of 650 nm and form factor corresponding to a 5.6 mm TO-18 package. The exemplary embodiment of capsule converging lens 46 is of plano-convex configuration having a diameter of 6 millimeters and an effective focal length of 60 millimeters.

As shown in FIG. 3, laser diode 28 generates a laser beam within diode capsule 26 which is propagated as a peripheral beam PB into peripheral beam channel 32, whereby the peripheral beam PB is refracted by diverging lens 12 as a coherent beam substantially parallel to the central beam channel 4 and becomes a part of resultant beam RB, where the power of resultant beam RB is proportional to the sum of the power of the central beam CB and of each peripheral beam PB.

The additional power added to an external central beam CB by a single beam module 10, as shown in FIGS. 1-3, can be approximated according to the equation:

$$P_R \approx P_C + (L_D \times P_P)$$

Where:
$P_R$ is the power of the resultant beam RB,
$P_C$ is the power of the external central beam CB,
$P_P$ is the power of each peripheral beam PB as generated by diode capsule 26
$L_D$ is the number of diode capsules 26 employed by beam module 10

In the illustrated embodiment shown in FIGS. 1-3, where each of the six diode capsules 26 generates a laser beam having a power of 1 W, and assuming a central beam CB having a power of 1 W, the power of the resultant beam RB can be approximated as:

$$P_R \approx 1W + (6 \times 1W) \approx 7W$$

Figure 4:
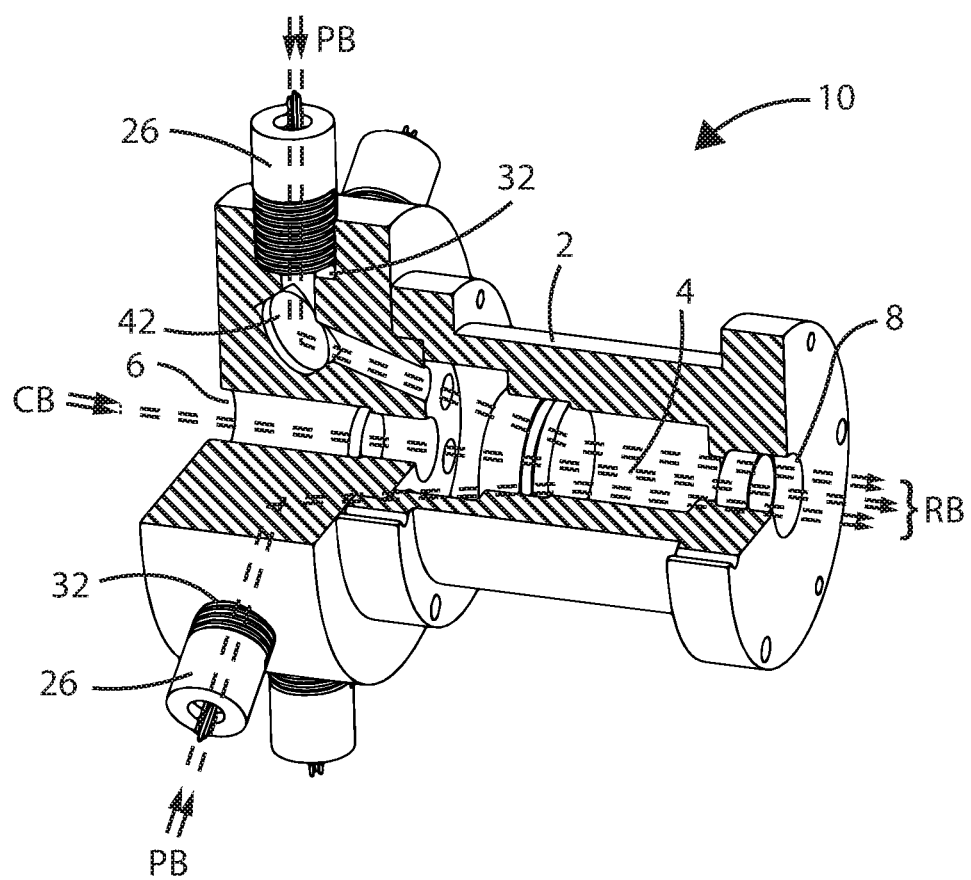
FIG. 4 illustrates a cut-away view of a preferred embodiment employing a reflective surface according to the present invention.
Figure 4A:
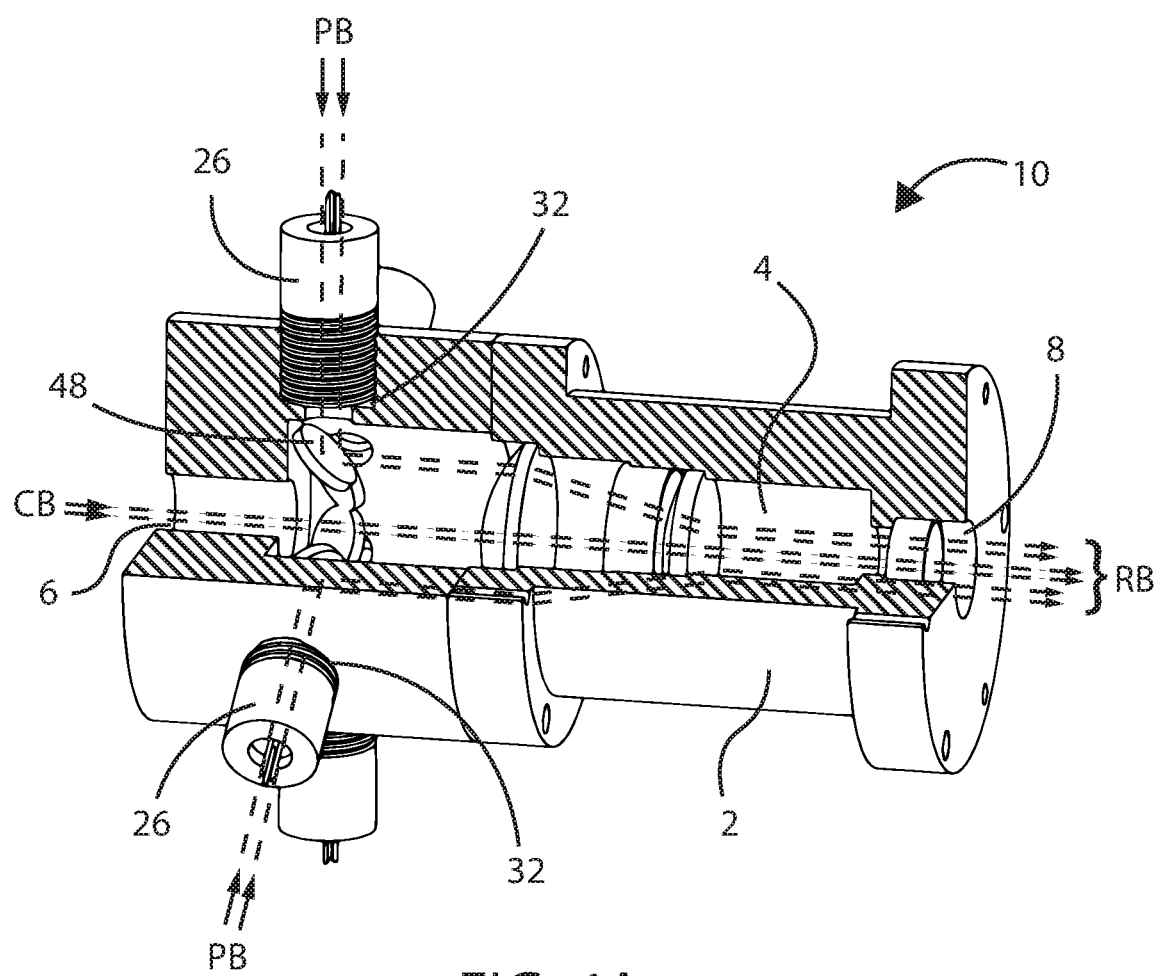
FIG. 4A illustrates a cut-away of a preferred embodiment employing an alternative reflective surface according to the present invention.

Now referring to FIGS. 4 and 4A, alternative embodiments of the present invention may further include a reflective surface 42 affixed to the housing structure, wherein the reflective surface 42 is oriented for directing the peripheral beam PB in a direction at a predetermined angle so the diverging lens 12 refracts the peripheral beam PB in a direction substantially parallel with the central beam CB to thereby propagate a resultant beam RB through the output port 8.

The illustrated embodiments in FIGS. 1-4 further include secondary converging lens 16 and secondary diverging lens 14 to reduce the circumscribed diameter of the resultant beam. Secondary converging lens 16 and second diverging lens 14 are affixed within the central beam channel 4 such that their principal planes are oriented in generally parallel alignment to each other and are in generally perpendicular alignment with the longitudinal axis of the central beam channel. Secondary converging lens 16 is spaced back at a predetermined distance from the secondary diverging lens 14 in a direction toward the input port 6 in order to generate a resultant beam RB of a predetermined diameter. In the exemplary embodiment such as shown in FIGS. 1-4, secondary converging lens 16 is of plano-convex configuration having a diameter of 21 millimeters and an effective focal length of 40 millimeters. The exemplary embodiment of secondary diverging lens 14 is of double-concave configuration having a diameter of 12 millimeters and an effective focal length of −11 millimeters.

The exemplary embodiment of the invention as illustrated in FIGS. 1-4 employs converging lens 22, diverging lens 12, secondary converging lens 16 and secondary diverging lens 14, each with their optical properties, such that an external central beam CB having up to 7 millimeters circumscribed beam diameter can propagate into the input port 6 of beam module 10, and a peripheral beam PB having up to 5 millimeters circumscribed beam diameter can propagate into the peripheral input port 32 of beam module 10, such that the resultant beam RB propagates from the output port 8 having a circumscribed beam diameter of less than 4 millimeters. In this way, the resultant beam RB from a one of the modules 10 is of suitable diameter for propagating into another of the beam modules 10 as a central beam CB or as a peripheral beam PB.

Figure 5:
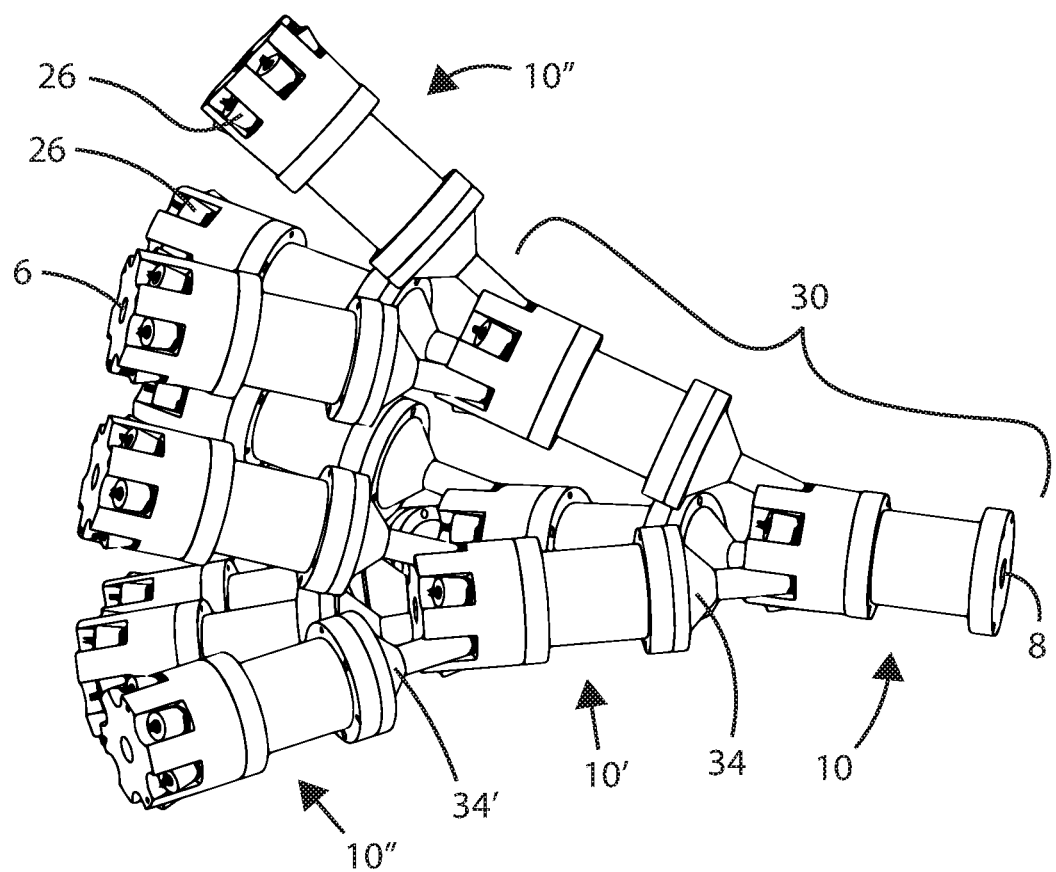
FIG. 5 illustrates a side perspective view showing the preferred embodiment of the stackable beam module assembly in a nested configuration.
Figure 6:
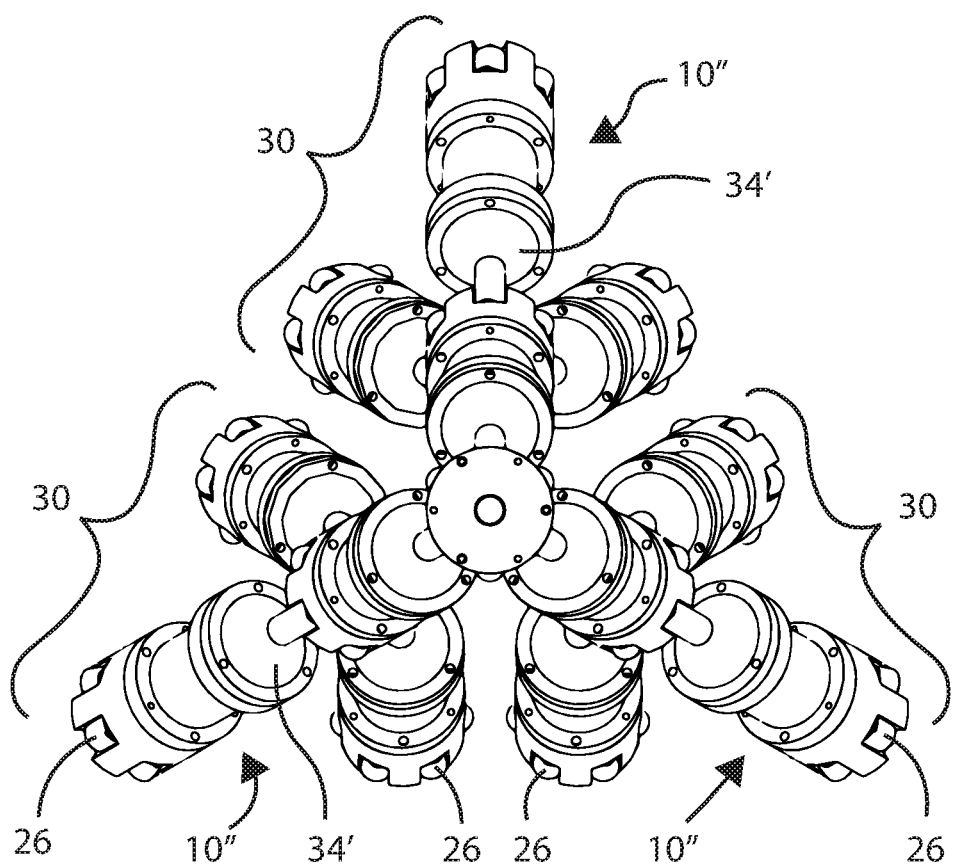
FIG. 6 illustrates a front perspective view showing the preferred embodiment of the stackable beam module assembly in a nested configuration.
Figure 7:
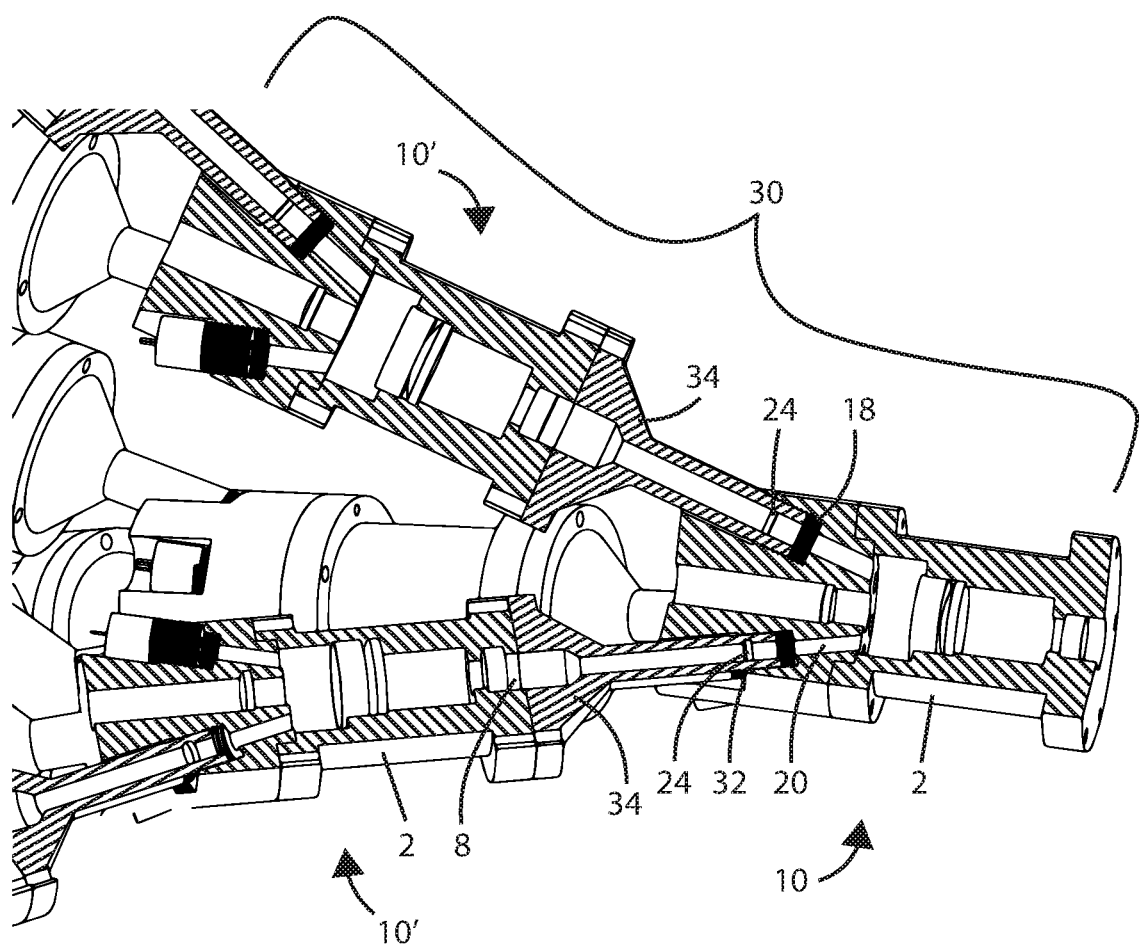
FIG. 7 is a cut-away view showing the interior components of the preferred embodiment when in the nested configuration illustrated in FIGS. 5 and 6.

As shown in FIGS. 5-7, a further feature of the illustrated embodiment are adaptive housings 34 and 34' that securely engage a plurality of the one of the beam modules 10' and 10'' with another of the beam modules 10 and 10' in nested configuration 30 such that a resultant beam RB propagating from the output port 8 of each of the one of the beam modules 10' comprises a peripheral beam PB directed through peripheral input port 32 of the another of the beam modules 10. Adaptive housing 34 has an adaptive inlet end and an adaptive outlet end and includes an adaptive converging lens 24 oriented between the adaptive inlet end and the adaptive outlet end, wherein the adaptive inlet end is coupled with the output port 8 of one of beam modules 10' and the adaptive outlet end is coupled with the peripheral input port 32 of another of the beam modules 10 whereby the adaptive housing 34 is spaced back to position the adaptive converging lens 24 such that the resultant beam RB of the one of the beam modules 10' is directed into the peripheral input port 32 of the another of the beam modules 10 as the peripheral beam PB. In this manner a plurality of beam modules 10, 10', and 10", together with a plurality of adaptive housings 34 and 34', are recursively connected in secured engagement such that multiple nested configurations 30 are in a recursive nested arrangement.

Adaptive housing 34 may further include a threaded portion proximal to the adaptive outlet end corresponding to the threaded connective recesses 18 radially spaced on an outer surface of housing 2, whereby engaging a corresponding threaded portion of the adaptive housing 34 positions the output port 8 of a one of the beam modules 10' at an angle whereby the resultant beam RB is directed through the adaptive housing 34 and into a peripheral input port 32 of another of the beam modules 10; and thereby propagates through peripheral beam channel 20 as peripheral beam PB of the another of the beam modules 10. An additional advantage of the threaded connector is its capability for ready adjustment of the spaced distance between the adaptive converging lens 24 and respective diverging lens 12 within the another of the beam modules 10, imparting added precision in orienting the resultant beam RB into the relevant peripheral beam channel 20.

The additional power added to an external central beam by a recursive arrangement of beam modules 10, 10', and 10" in nested configurations 30, as shown in FIGS. 5-7, can be approximated according to the equation:

$$P_R \approx P_C + P_R \times \left[ \left( \sum_{n=1}^{R_0-1} (K_D \times M_N^{n-1}) \right) + (L_D * M_N^{R_0}) \right]$$

Where:
$P_R$ is the power of the resultant beam RB,
$P_C$ is the power of the external central beam CB,
$P_P$ is the power of each peripheral beam PB as generated by diode capsule 26
$L_D$ is the number of diode capsules 26 employed by each of the one of the beam modules 10"
$K_D$ is the number of diode capsules 26 employed by each of the another of the beam modules 10 and 10'
$M_N$ is the number of beam modules 10' and 10" comprising the plurality of one of the beam modules in nested configuration with another of the beam modules 10 and 10'
$R_0$ is the number of recursive stages of nested configurations 30 within the arrangement In the illustrated embodiment shown in FIGS. 5-7, where each of the diode capsules 26 generates a laser beam having a power of 1 W, and assuming a central beam CB having a power of 1 W, the power of the resultant beam RB can be approximated as:

$$P_R \approx 1\ W + 1\ W \times \left[ \left( \sum_{n=1}^{2-1} (3 \times 3^{n-1}) \right) + (6 \times 3^2) \right] \approx 67\ W$$

Figure 8:
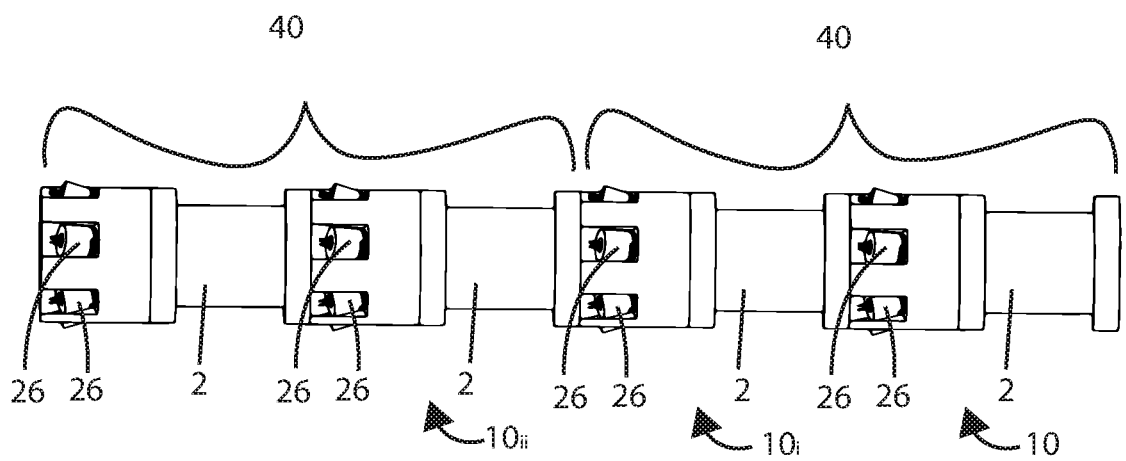
FIG. 8 illustrates a side perspective view showing the preferred embodiment of the stackable beam module assembly of FIGS. 1, 2 and 3 in sequential configuration.
Figure 9:
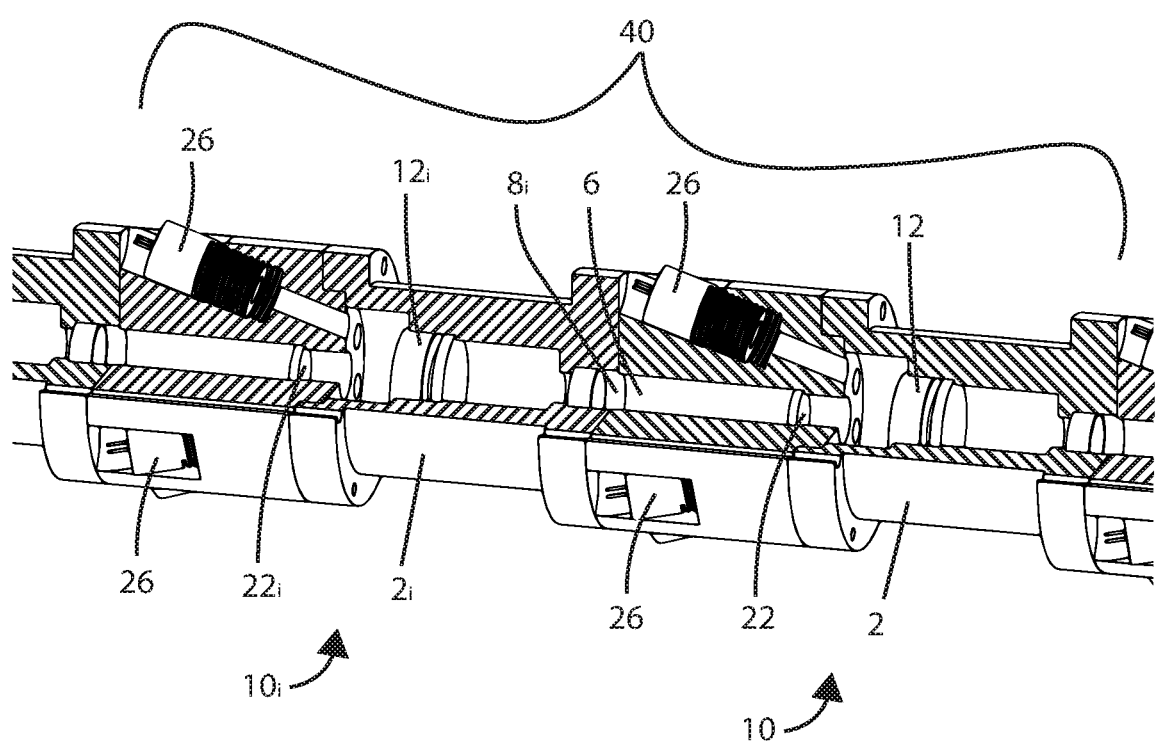
FIG. 9 is a cut-away view showing the interior components of the preferred embodiment when in the sequential configuration illustrated in FIG. 8.

As shown in FIGS. 8-9, a further feature of the illustrated embodiment is provision for a one of the beam modules $10_i$ to be connected in coupled engagement with an another of the beam modules 10 in a sequential configuration 40. In this configuration, the connective coupler proximal to the output port 8 of a one of the beam modules $10_i$ is coupled with the connective structure proximal to the input port 6 of another of the beam modules 10 such that the longitudinal axes of the housing 2 of the another of the beam modules 10 and of the housing $2_i$ of the one of the beam modules $10_i$ are collinear. In this manner, the resultant beam RB of a one of the beam modules $10_i$ and $10_{ii}$ propagates as the central beam CB of the another of the beam modules 10 and $10_i$. Thus, a plurality of beam modules 10, $10_i$, and $10_{ii}$ are recursively connected in coupled engagement such that multiple sequential configurations 40 are in a recursive sequential configuration.

The additional power added to an external central beam by a recursive arrangement of beam modules 10, $10_i$, and $10_{ii}$ in sequential configurations 40, as shown in FIGS. 8-9, can be approximated according to the equation:

$$P_R \approx P_C + P_P \times (L_D \times S_0)$$

Where:
$P_R$ is the power of the resultant beam RB,
$P_C$ is the power of the external central beam CB,
$P_P$ is the power of each peripheral beam PB as generated by diode capsule 26
$L_D$ is the number of diode capsules 26 employed by each of the beam modules 10, $10_i$, and $10_{ii}$
$S_0$ is the total number of beam modules 10, $10_i$, and $10_{ii}$ in sequential configurations 40 within the recursive arrangement In the illustrated embodiment shown in FIGS. 8-9, where each of the beam modules 10, $10_i$, and $10_{ii}$ employ six diode capsules 26 and where each diode capsule 26 generates a laser beam having a power of 1 W, and assuming a central beam CB having a power of 1 W, the power of the resultant beam RB can be approximated as:

$$P_R \approx 1W + 1W \times (6 \times 4) \approx 25W$$

Alternative embodiments of the present invention may employ various adaptive connective structures for stacking laser modules 10, 10', 10", $10_i$, and $10_{ii}$ in arrangements with nested configurations 30 such as shown in FIGS. 5-7 or sequential configurations 40 such as shown in FIGS. 8-9; or a combination thereof such that the resultant beams RB propagated from output ports 8 of a one of the beam modules are directed as central beams CB or as peripheral beams PB in another of the beam modules, and are refracted by the diverging lens 12 in central beam channel 4 to further propagate substantially coaxial resultant beams RB that are neither diverging nor converging.

In alternative embodiments, various of commercially available connective structures and connective couplers are employed to configure beam modules in accordance with the present invention. Examples of such fasteners include hammer or drive pins and similar fasteners wherein a protuberance with a slightly larger diameter is configured for tensioned engagement with a corresponding recess such that the outlet port 8 of a one of the beam modules 10 thereby propagates a resultant beam RB as a central beam CB into the input port 6, or as a peripheral beam PB into a peripheral input port 32, of another of the beam modules 10. In yet other embodiments, a clamping device may engage the corresponding connective couplers and connective structures. In yet other embodiments, a connective protuberance and recess may be permanently engaged by welding or heating the corresponding connective couplers and connective structures.

As will be apparent to design engineers of ordinary skill in the field of laser devices, alternative embodiments of the present invention may incorporate additional diverging, converging and collimating lenses in the beam module, including lenses with aspheric form having optical properties which reduce spherical aberrations. Such and other additions or modifications to manipulate and project laser beams that are coherent or of particular power outputs, diameters or properties are well known in the field. It is intended that any variation of the present invention that includes one or more lens, channel or combination of recursive and sequential configurations providing the claimed laser beam features and functionalities is included within the spirit and scope of the appended claims.

While the foregoing written description of the invention enables one of ordinary skill to make and use what is considered presently to be the best mode thereof, those of ordinary skill will understand and appreciate the existence of variations, combinations, and equivalents of the specific embodiment, method, and examples herein. The invention should therefore not be limited by the above described embodiment, method, and examples, but by all embodiments and methods within the scope and spirit of the invention as claimed.

The invention claimed is:

1. A stackable beam module assembly for combining a plurality of beams, comprising:
   at least one beam module, including;
   a housing having a central beam channel disposed along a longitudinal axis of the housing, wherein an input port and an output port are disposed on opposing ends of the central beam channel whereby a central beam propagating into the input port travels along the central beam channel; and
   at least one peripheral beam channel having a peripheral input port, wherein the peripheral input port is configured for directing a peripheral beam along a peripheral beam axis at a predetermined angle toward the central beam channel; and
   a diverging lens affixed within the central beam channel such that the optical plane of the diverging lens is in generally perpendicular alignment with the longitudinal axis of the housing, wherein the diverging lens is spaced in a direction toward the output port at a distance predetermined by arrangement of the at least one peripheral beam channel and the optical properties of the diverging lens;
   whereby the at least one peripheral beam propagating through the peripheral beam channel is refracted by the diverging lens as a coherent beam substantially parallel to the central beam channel;
   wherein a resultant beam propagates from the outlet end which includes the central beam and the at least one peripheral beam such that the power of the resultant beam is proportional to the sum of the central beam and the at least one peripheral beam.

2. The stackable beam module assembly of claim 1, further comprising a converging lens affixed within the central beam channel such that the optical plane of the converging lens is in generally perpendicular alignment with the longitudinal axis of the housing, wherein the converging lens is spaced in a direction toward the input port such that the focal point of the converging lens and of the diverging lens are substantially coincident;
   whereby a coherent central beam propagating into the input port is refracted by the converging lens, and subsequently by the diverging lens, as a coherent beam substantially coaxial with the central beam channel;
   wherein a coherent resultant beam propagates from the outlet end which includes the central beam and the at least one peripheral beam such that the power of the resultant beam is proportional to the sum of the central beam and the at least one peripheral beam.

3. The stackable beam module assembly of claim 2 wherein the at least one beam module includes a plurality of beam modules, and further comprising:
   a connective structure disposed on an exterior surface of the housing proximal to the input port of another of the beam modules; and
   a connective coupler proximate to the output port of one of the beam modules, wherein engagement of the connective coupler with the connective structure couples the output port of one of the beam modules with the input port of another of the beam modules such that the longitudinal axes of the housings of the beam modules are collinear;
   whereby the resultant beam from the output port of the one of the beam modules propagates as a central beam of the another of the beam modules to thereby connect the one of the beam modules and the another of the beam modules in a sequential configuration.

4. The stackable beam module assembly of claim 1, wherein the at least one peripheral beam channel includes a plurality of peripheral beam channels and further comprising:
   a plurality of connective recesses disposed in radial arrangement on an exterior surface of the housing proximal to a corresponding plurality of peripheral input ports of the plurality of peripheral beam channels of another of the beam modules; and
   a connective coupler proximate to the output port of a one of the beam modules, wherein coupled engagement of the connective recess and the connective coupler portion couples the output port of one of the beam modules with a corresponding one of the peripheral input ports of another of the beam modules, positioning the one of the beam modules in a nested configuration such that the resultant beam of the one of the beam modules is directed into the peripheral input ports of the another of the beam modules as a peripheral beam.

5. The stackable beam module assembly of claim 4, further comprising:
   at least one adaptive housing, wherein the at least one adaptive housing includes a plurality of adaptive housings, including:
   an adaptive inlet end and an adaptive outlet end, wherein the adaptive housings include an adaptive converging lens oriented between the adaptive inlet end and the adaptive outlet end, and
   wherein the adaptive inlet end is coupled with the connective coupler proximate to the output port of the one of the beam modules and the adaptive outlet end is coupled with the connective recesses of corresponding peripheral input ports of the another of the beam modules whereby the adaptive converging lens is spaced back at a predetermined distance according to the optical properties of the adaptive converging lens and the optical properties of the diverging lens such that the resultant beam of the one of the beam modules is directed into the peripheral input port of the another of the beam modules as a peripheral beam.

6. The plurality of stackable beam module assemblies arranged in a sequential stack of claim 3, wherein at least one of the beam modules is comprised of a plurality of stackable beam module assemblies arranged in a nested configuration, such that a plurality of beam modules are arranged in a nested-sequential hybrid configuration.

7. The plurality of stackable beam module assemblies arranged in a nested configuration of claim 4, wherein at least one of the beam modules is comprised of a plurality of stackable beam module assemblies arranged in a sequential stack, such that a plurality of beam modules are arranged in a sequential-nested hybrid configuration.

8. The stackable beam module assembly of claim 5, wherein the connective recesses include a threaded wall and wherein the adaptive housing has a threaded portion proximate to the adaptive outlet end corresponding to the threaded wall, such that engagement of the threaded wall and the threaded portion orients the one of the beam modules in a nested configuration.

9. The stackable beam module of assembly of claim 4, wherein the connective recesses are radially spaced about an outer surface of the housing of the beam module and wherein the connective coupler includes a casing with a slightly larger diameter configured for tensioned engagement with the recess such that the resultant beam from the output port of the one of the beam modules thereby propagates into the peripheral input port as a peripheral beam of the another of the beam modules.

10. The stackable beam module assembly of claim 1, further comprising a peripheral converging lens mounted within the peripheral input port of the beam module such that the peripheral converging lens has a focal length to thereby refract a coherent peripheral beam in a converging direction whereby subsequent refraction of the peripheral beam through the diverging lens propagates a coherent beam substantially parallel to the central beam channel.

11. The stackable beam module assembly of claim 1, wherein the connective recesses include a threaded portion and further comprising;
at least one diode capsule, wherein the at least one diode capsule includes a plurality of diode capsules, having:
an outer surface with a threaded length for coupled engagement with the threaded portion of a corresponding connective recess; and
a laser diode and collimating lens oriented within the diode capsule such that threaded engagement of the threaded length and threaded portion propagates a laser beam along the peripheral beam axis of the beam module; and
a capsule converging lens oriented within the diode capsule spaced in a predetermined position according to the optical properties of the capsule converging lens, the optical properties of the diverging lens, and the position of the diode capsule within the connective recess;
wherein a laser beam propagated by the laser diode and collimating lens is refracted by the capsule converging lens into a converging beam which propagates as a peripheral beam in a direction that refracts through the diverging lens to thereby propagate a coherent beam substantially parallel to the central beam channel.

12. The stackable beam module of assembly of claim 11, wherein the connective recesses are radially spaced about an outer surface of the housing of the beam module, and
wherein the outer surface of the one or more diode capsules has a slightly larger diameter configured for tensioned engagement with the corresponding connective recess such that the laser beam propagating from the diode capsule thereby propagates into the peripheral input port as the peripheral beam of the beam module.

13. The stackable beam module of claim 11, having;
at least one diode capsule in threaded engagement with a corresponding connective recess;
wherein each diode capsule propagates a laser beam through the corresponding peripheral beam channel as a peripheral beam, such that each peripheral beam is refracted by the diverging lens and propagates as a coherent beam substantially coaxial with the central beam channel;
wherein a resultant beam propagates from the outlet end which includes the at least one peripheral beam such that the power of the resultant beam is proportional to the sum of the at least one peripheral beam.

14. The stackable beam module of claim 13, further comprising:
a central beam propagated into the input port from an external source;
wherein a resultant beam propagates from the outlet end which includes the central beam and the at least one peripheral beam such that the power of the resultant beam is proportional to the sum of the central beam and the at least one peripheral beam.

15. The stackable beam module assembly of claim 1, further comprising;
at least one reflective surface affixed within the housing structure, wherein the at least one reflective surface is oriented for directing a corresponding peripheral beam in a direction at a predetermined angle toward the diverging lens;
wherein a corresponding peripheral beam is reflected by the reflective surface and subsequently refracted by the diverging lens as a coherent beam in a direction substantially parallel to the central beam channel.

16. The stackable beam module assembly of claim 14 wherein the at least one beam module includes a plurality of beam modules, and further comprising:
a connective structure disposed on an exterior surface of the housing proximal to the input port of another of the beam modules; and
a connective coupler proximate to the output port of one of the beam modules, wherein engagement of the connective coupler with the connective structure couples the output port of one of the beam modules with the input port of another of the beam modules such that the longitudinal axes of the housings of the beam modules are collinear;
whereby the resultant beam from the output port of the one of the beam modules propagates as a central beam of the another of the beam modules to thereby connect the one of the beam modules and the another of the beam modules in a sequential configuration.

17. The stackable beam module assembly of claim 13, wherein the at least one peripheral beam channel includes a plurality of peripheral beam channels and further comprising:
a plurality of connective recesses disposed in radial arrangement on an exterior surface of the housing proximal to corresponding plurality of peripheral input ports of the plurality of peripheral beam channels of another of the beam modules; and
a connective coupler portion proximate to the output port of a one of the beam modules, wherein coupled engagement of the connective recess and the connective coupler portion couples the output port of one of the beam modules with a corresponding one of the peripheral input ports of another of the beam modules, positioning the one of the beam modules in a nested configuration such that the resultant beam of the one of the beam modules is directed into the peripheral input ports of the another of the beam modules as a peripheral beam.

18. The stackable beam module assembly of claim 1, further comprising:
a secondary converging lens and a secondary diverging lens, wherein the secondary converging lens is spaced back from the diverging lens in a direction toward the output port and the secondary diverging lens is spaced back from the secondary converging lens in a direction toward the output port at a predetermined distance according to the optical properties of the secondary converging lens and of the secondary diverging lens;
wherein the coherent beam propagating from the diverging lens has a certain circumscribed beam diameter and is refracted by the secondary converging lens and secondary diverging lens to propagate a coherent beam having a smaller circumscribed beam diameter.

\* \* \* \* \*